(12) United States Patent (10) Patent No.: US 7,501,317 B2
Matsuda et al. (45) Date of Patent: Mar. 10, 2009

(54) METHOD OF MANUFACTURING SEMICONDUCTOR DEVICE

(75) Inventors: Tomoko Matsuda, Kanagawa (JP); Hiroshi Kitajima, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 13 days.

(21) Appl. No.: 11/640,892

(22) Filed: Dec. 19, 2006

(65) Prior Publication Data

US 2007/0161197 A1 Jul. 12, 2007

(30) Foreign Application Priority Data

Jan. 6, 2006 (JP) ............... 2006-001658

(51) Int. Cl.
*H01L 21/8232* (2006.01)
*H01L 21/335* (2006.01)
*H01L 21/4763* (2006.01)

(52) U.S. Cl. ............ 438/142; 438/174; 438/181; 438/184; 438/194; 438/301; 438/303; 438/595; 438/630; 438/721; 257/E21.632

(58) Field of Classification Search .......... 438/142, 438/174, 181, 184, 194, 301, 303, 630, 721; 257/E21.632
See application file for complete search history.

(56) References Cited

U.S. PATENT DOCUMENTS 5,472,896 A * 12/1995 Chen et al. ............... 438/305
5,545,578 A * 8/1996 Park et al. ................ 438/303
6,096,607 A * 8/2000 Ueno ....................... 438/268
6,323,077 B1 * 11/2001 Guo ........................ 438/231
6,472,283 B1 * 10/2002 Ishida et al. .............. 438/305

(Continued)

FOREIGN PATENT DOCUMENTS

JP 2005-159336 6/2005

OTHER PUBLICATIONS

English machine translation of 2005-159336 published Jun. 2005. pp. 1-10. Retrieved from AIPN/Online translation by Examiner Feb. 22, 2008.*

(Continued)

*Primary Examiner*—Walter L Lindsay, Jr.
*Assistant Examiner*—Mohsen Ahmadi
(74) *Attorney, Agent, or Firm*—McGinn IP Law Group, PLLC

(57) ABSTRACT

A junction leak current of a transistor including a silicide layer provided on a source/drain region is to be suppressed. After forming a gate electrode over a chip-side surface of a silicon substrate, an insulating layer is formed over the gate electrode. The insulating layer is etched back so as to form a sidewall that covers the sidewall of the gate electrode, and a region adjacent to the sidewall on the chip-side surface of the silicon substrate, where a source/drain region is to be formed, is etched so as to form a generally horizontal scraped section on the chip-side surface. Then a dopant is implanted to the silicon substrate around the gate electrode, to thereby form the source/drain region. On the chip-side surface of the silicon substrate where the gate electrode is provided, a Ni layer is formed, so that the Ni layer is reacted with the silicon substrate thus to form a Ni-silicide layer.

11 Claims, 4 Drawing Sheets

U.S. PATENT DOCUMENTS

| | | | |
|---|---|---|---|
| 7,022,575 B2 * | 4/2006 | Iizuka et al. | 438/303 |
| 7,211,871 B2 * | 5/2007 | Cho | 257/408 |
| 2005/0136629 A1 | 6/2005 | Iizuka et al. | |

OTHER PUBLICATIONS

Chinese Office Action dated May 30, 2008 with English Translation.

* cited by examiner

METHOD OF MANUFACTURING SEMICONDUCTOR DEVICE

This application is based on Japanese patent application No. 2006-001658, the content of which is incorporated hereinto by reference.

BACKGROUND

1. Technical Field

The present invention relates to a method of manufacturing a semiconductor device including a field effect transistor provided on a silicon substrate.

2. Related Art

There are many technologies to form silicide layer on a silicon substrate for semiconductor process. The resistance of gate electrode or source/drain is reduced by using the silicide layer. JP-A No. 2005-159336 is one of a related art to show those semiconductor processing technologies.

This document discloses a formation process of a silicide layer in a semiconductor device having an LDD (Lightly Doped Drain) structure. According to the disclosure, firstly a gate electrode and a low concentration doped region are formed on the silicon substrate, and a spacer is formed on a lateral face of the gate electrode. Then a buffer layer, constituted of an insulating layer, is formed on the silicon substrate, and dopant is implanted to form source/drain region. The buffer layer is then removed by a dry etching process. Through such process, the formation of the spacer, as well as the removal of the buffer layer, incurs an over-etching of the silicon substrate to a similar extent.

[Patented document 1] JP-A No. 2005-159336

In the foregoing process, however, the formation of the high concentration doped region is followed by the dry etching of the silicon substrate. Accordingly, despite having implanted the dopant with high concentraion to a predetermined depth, the high dose-implanted region that serves as a source/drain region becomes too shallow because the surface of the implanted region is removed through the dry etching process. On the other hand, the junction position of the high dose-implanted region remains substantially unchanged. As a result, a junction leakage current increases by substantially shallowering high concentration region under the silicide layer. Therefore, the method has a room for improvement from the viewpoint of suppressing a junction leak current of the transistor after being formed into a silicide.

In this respect, the cited document proposes a method of keeping the silicon from being scraped, in order to prevent the reduction in depth of the doped region because of the over-etching. Specifically, the etching of the insulating layer for forming the spacer is performed in two steps. A silicon nitride layer is employed as the buffer layer, and the silicon nitride layer is removed by etching after the ion implantation. Such steps, according to the cited document, prevent the silicon from being scraped, during the formation of the spacer and the removal of the buffer layer.

In the vicinity of the surface of the silicon substrate, however, dopant for forming a well or a channel region is introduced, prior to forming the source/drain region. Besides, dopant for forming a pocket region may be introduced. These dopants are of the opposite conductive type to those introduced for forming the source/drain region.

In case of preventing the surface of the silicon substrate from being scraped as shown in the cited document, the dopant of the opposite conductive type is present in the vicinity of the surface of the source/drain region, and increase the resisitivity of the source/drain region. Accordingly, the foregoing method has a room for improvement from the viewpoint of securing an effective junction depth of the source/drain region.

SUMMARY OF THE INVENTION

According to the present invention, there is provided a method of manufacturing a semiconductor device, comprising:

forming a gate electrode over a chip-side surface of a silicon substrate;

forming an insulating layer over the gate electrode;

forming a sidewall that covers the side of the gate electrode by etching back the insulating layer on the gate electrode and on the silicon substrate, and removing by etching a portion of the chip-side surface of the silicon substrate in a region adjacent to the sidewall where a source/drain region is to be formed, thereby forming a generally horizontal scraped section on the chip-side surface;

ion-implanting a dopant to the silicon substrate around the gate electrode after forming the sidewall and the scraped section, thereby forming the source/drain region;

forming a metal layer on the scraped section of the silicon substrate where the gate electrode is provided; and reacting the metal layer with the silicon substrate thereby forming a silicide layer on the source/drain region.

According to the method thus arranged, the sidewall is formed, and also the generally horizontal scraped section is formed in the region on the chip-side surface of the silicon substrate where the source/drain region is to be formed. Then after forming the scraped section, the source/drain region is formed. This is further followed by formation of the metal layer on the scraped section, and formation of the silicide layer on the source/drain region. Such arrangement allows removing the surface layer which contains relatively high concentration dopant of the opposite conductive type from the source/drain, before implanting the source/drain dopant. As a result, undesirable resistivity increase of source/drain region, which is caused by compensation of the opposite conductive type dopant, can be avoided. The method according to the present invention, therefore, allows stably forming the source/drain region in a predetermined junction depth, thus preventing reduction in effective junction depth.

As described above, the scraped section is formed before forming the source/drain region. Such arrangement allows, unlike the method according to the patented document 1, preventing the scraped section from being additionally scraped deeper into the substrate, after forming the source/drain region. The method according to the present invention, therefore, effectively prevents reduction in depth of the source/drain region, thereby enabling securing a sufficient junction depth.

The method according to the present invention may include cleaning an entire surface of the silicon substrate with a chemical solution, after forming the source/drain region and before forming the metal layer on the scraped section. Such arrangement facilitates further stabilizing the formation process of the metal layer on the scraped section.

Referring to the above, the cleaning of the entire surface of the silicon substrate may constitute a pretreatment before forming the metal layer in the siliciding process. When cleaning the silicon substrate, it is undesirable to additionally etch the scraped section formed on the silicon substrate. However, an unintentional etching effect may be incurred in the cleaning process, as long as a change in height of the scraped section is practically negligible with respect to the depth of the source/drain region. Specifically, the change in height of the scraped section of the silicon substrate because of the cleaning is permissible if it is smaller than the scraped depth of the scraped section from the chip-side surface. More specifically, the change in height of the scraped section because of the cleaning is permissible if it is less than 5 nm.

In the method according to the present invention, forming the sidewall and forming the scraped section may include removing the insulating layer on the gate electrode and on the silicon substrate by etching back under a first condition thereby forming the sidewall and exposing the chip-side surface of the silicon substrate, and etching the silicon substrate under a second condition thereby forming the scraped section.

After etching back for forming the sidewall and forming the scraped section on the silicon substrate, additional etching of the exposed silicon surface of the substrate enable the higher etching selectivity between the silicon substrate and the insulating layer in the respective steps. To be more detailed, the first condition may adopt a higher etching rate for the insulating layer with respect to the silicon substrate, while the second condition may adopt a higher etching rate for the silicon substrate with respect to the insulating layer. Such arrangement facilitates further restricting reduction in thickness of the sidewall because of the etching effect on the insulating layer during the formation of the scraped section. Therefore, regardless of the further shrinkage of the semiconductor device, the method including forming the scraped section allows further stabilizing the manufacturing process of the semiconductor device.

In the method according to the present invention, the metal layer may contain nickel, and the silicide layer may be a nickel silicide layer. Also, under such structure, a surface of the stepped portion in the silicon substrate between the chip-side surface and the scraped section may be generally parallel to the normal of the silicon substrate. Such configuration prevents the nickel-containing layer from "slipping in" from the sidewall to the scraped section, during the formation of the nickel silicide layer on the source/drain region.

Here, the term "slip-in" of the nickel contained in the metal layer herein refers to a phenomenon that the nickel-containing layer deposited on the sidewall migrates along the surface of the sidewall during the siliciding reaction, and then slips down into the source/drain region on the silicon substrate. In the case where the slip-in takes place during the siliciding reaction, the nickel-containing layer which has migrated from the sidewall is excessively supplied to the source/drain region in addition to the nickel-containing layer originally deposited thereon. This may lead to the overreaction between the nickel and the silicon substrate.

The slip-in is a phenomenon newly discovered by the present inventor through the studies relevant to the nickel-containing layer. The present inventor has been attempting to shorten a gate length of a transistor with respect to the case of employing nickel silicide as a silicide layer, as a part of the attempts of decreasing the gate length of field effect transistors for achieving higher operating speed. Through such study it has been discovered, as a result of reduction in distance between the gate electrodes, that in the process of forming the nickel silicide the overreaction of the nickel more prominently takes place in a region where a distance between the gate electrodes is shorter.

This has driven the present inventor to intensively study the reason that the overreaction of the nickel more prominently takes place in the region where the distance between the gate electrodes is shorter. As a result, two probable reasons have been reached; that in a concentrated region nickel is more readily reacted thereby turning into NiSi2, and the "slip-in" of the nickel-containing layer deposited on the sidewall more readily takes place.

The foregoing configuration more effectively prevents the slip-in of the nickel-containing layer into the source/drain region. This suppresses the overreaction between the silicon substrate and the nickel in the source/drain region. Therefore, the Ni-silicide layer can be stably formed in the source/drain region. In addition, suppressing the overreaction effectively prevents the reduction in depth of the source/drain region, thus resulting in suppression of a junction leak current in the source/drain region.

Although the reason that the slip-in takes place in a layer containing nickel may not be fully identified yet, the relatively low affinity between the sidewall and the nickel-containing layer is considered to be a weighty reason.

It should be noted that any combination of the foregoing configurations, and conversion of the expressions according to the present invention between methods and apparatus are included in the scope of the present invention.

Thus, the present invention provides a technique of suppressing a junction leak current of a transistor including a silicide layer.

BRIEF DESCRIPTION OF THE DRAWINGS

The above and other objects, advantages and features of the present invention will be more apparent from the following description taken in conjunction with the accompanying drawings, in which.

DETAILED DESCRIPTION

Figure 1:
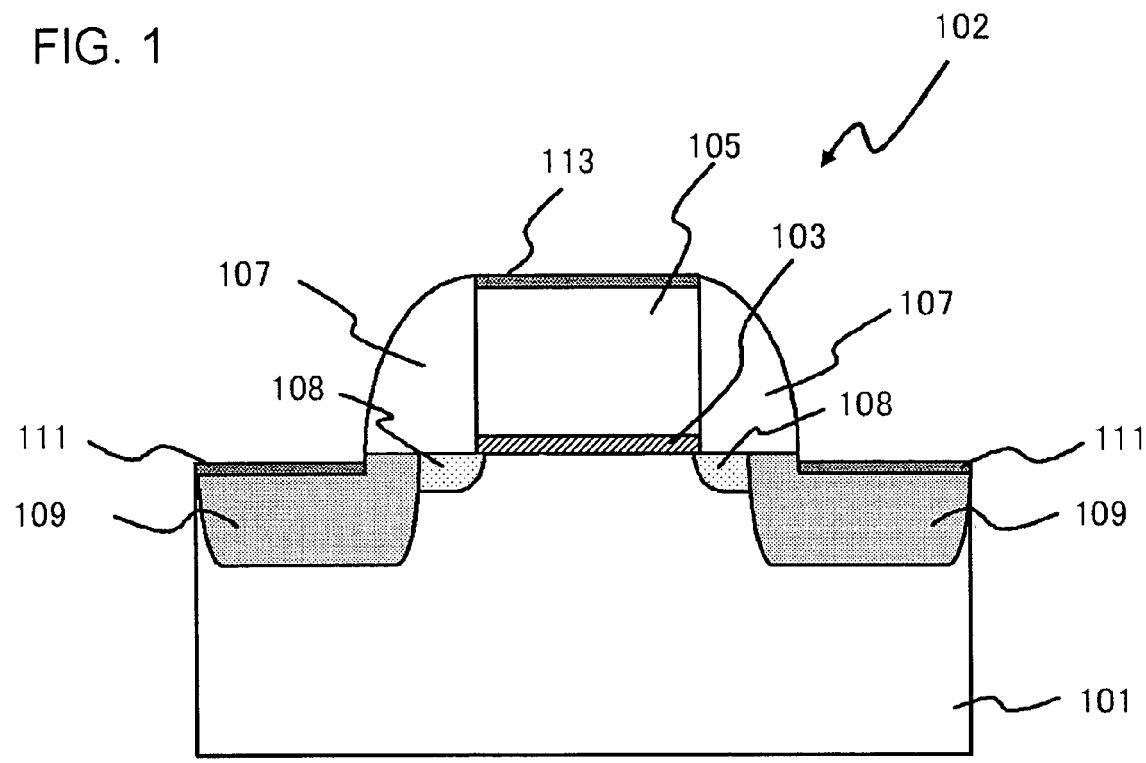
FIG. 1 is a cross-sectional view showing a semiconductor device according to an embodiment.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Hereunder, exemplary embodiments of the present invention will be described in details, referring to the accompanying drawings. In the drawings, same constituents are given the same numerals, and the description thereof will not be repeated.

FIG. 1 is a cross-sectional view showing a semiconductor device according to the embodiment. The semiconductor device 100 shown in FIG. 1 includes a silicon substrate 101 and a MOSFET 102 provided on the silicon substrate 101.

The MOSFET 102 includes a source region and a drain region 109 provided close to a surface of the silicon substrate 101, a source/drain extension (SD extension) region 108 provided on the source/drain regions 109, a channel region (not shown) provided between the source region and the drain regions 109, a gate insulating layer 103 provided on the channel region, a gate electrode 105 provided on the gate insulating layer 103, and a sidewall insulating layer (sidewall 107) that covers a sidewall of the gate insulating layer 103 and the gate electrode 105. On the gate electrode 105, Ni-silicide layer 113 is provided. In the top region of the source/drain regions 109, Ni-silicide layer 111 is provided except for the area under the sidewall 107.

The source/drain region 109 is a dopant diffusion region that serves as the source or drain of the MOSFET 102.

In a region to be formed the source/drain region 109 in, the silicon substrate 101 is scraped from an end portion of an isolation region (not shown) to an end portion of the sidewall 107, so that the surface of the silicon substrate 101 is at a lower level (deeper into the silicon substrate 101) than the surface thereof in a region right below the gate electrode 105 (chip-side surface 123 shown in FIG. 2C). Also, the upper surface of the Ni-silicide layer 111 is closer to an inner portion of the silicon substrate 101 (lower in FIG. 1) than a region right under the gate insulating layer 103.

Here, this embodiment refers to the case where a metal layer (FIG. 3B) contains nickel, and the silicide layer is the Ni-silicide layer 111. However, the metal constituting a silicide layer formed on the source/drain region 109 and on the gate electrode 105 is not limited to nickel. The silicide layer may be constituted of a silicide compound of those metals that can be silicided, such as Co, Ti, Fe, Pd, and Pt, in addition to Ni.

The level of the upper surface of the Ni-silicide layer 111 is not specifically limited. However, in the case where a metal in the silicide layer slips into the source/drain region like the nickel in this embodiment, it is preferable that the upper surface of the Ni-silicide layer 111 is located closer to an inner portion of the substrate than the surface of the silicon substrate 101 right under the gate insulating layer 103. Such configuration allows, as will be subsequently described, enhancing the suppressing effect against the slip-in of the Ni layer from the sidewall 107, during the manufacturing process of the semiconductor device 100.

The gate insulating layer 103 may be an oxide layer such as an $SiO_2$ layer, or an oxide-nitride layer such as an SiON layer. In the following passages, the gate insulating layer 103 will be assumed to be an $SiO_2$ layer. The gate insulating layer 103 may also be a high-dielectric-constant layer. The high-dielectric-constant layer has a higher specific dielectric constant than the $SiO_2$ layer, and may be constituted of what is known as a high-k material. The high-dielectric-constant layer may be constituted of a material having a specific dielectric constant of 6 or higher. More specifically, the high-dielectric-constant layer may be constituted of a material containing at least one metal element selected from the group consisting of Hf and Zr, and hence may be an oxide layer, a silicate layer or the like containing any of such metal elements.

The gate electrode 105 may be constituted of a conductive layer containing silicon. More specifically, the gate electrode 105 may be constituted of a polycrystalline silicon layer.

The sidewall 107 is an insulating layer, and may be constituted of an oxide layer such as an SiO2 layer, or an oxide-nitride layer such as an SiON layer.

Hereunder, a method of manufacturing the semiconductor device 100 shown in FIG. 1 will be described. FIGS. 2A to 2C, and 3A to 3C are cross-sectional views sequentially showing the manufacturing process of the semiconductor device 100. The semiconductor device 100 can be obtained by forming the MOSFET 102 on the silicon substrate 101.

The manufacturing process of the semiconductor device 100 includes the following steps.

Step 101: forming the gate insulating layer 103 and then foriming the gate electrode 105 over the chip-side surface of the silicon substrate 101 in that order, pertterning;

Step 103: forming an insulating layer (not shown) over the gate electrode 105 to cover the silicon substrate 101;

Step 105: etching back the insulating layer on the gate electrode 105 and on the silicon substrate 101 so as to form a sidewall 107 that covers the side of the gate electrode 105, and removing by etching a portion of the chip-side surface 123 of the silicon substrate 101 in a region adjacent to the sidewall 107 where a source/drain region 109 is to be formed, thereby forming a generally horizontal scraped section 121 on the chip-side surface 123;

Step 107: ion-implanting a dopant to the silicon substrate 101 around the gate electrode 105 after the step 105, thereby forming the source/drain region 109;

Step 109: cleaning an entire surface of the silicon substrate 101 with a chemical solution, after the step 107 and before the step 111 to be described below;

Step 111: forming after the step 107 a metal layer (Ni layer 115) on the chip-side surface 123 of the silicon substrate 101 where the gate electrode 105 is provided; and Step 113: reacting the Ni layer 115 with the silicon substrate 101 thereby forming a silicide layer (Ni-silicide layer 111) on the source/drain region 109.

The step 105 of forming the sidewall 107 and forming the scraped section 121 may include:

Step 115: removing the insulating layer on the gate electrode 105 and on the silicon substrate 101 by etching back under a first condition thereby forming the sidewall 107 and exposing the chip-side surface 123 of the silicon substrate 101, and step 117: etching the silicon substrate 101 under a second condition thereby forming the scraped section 121, after the step 115 of exposing the chip-side surface 123 of the silicon substrate 101.

The first condition in the step 115 specifies a selective etching of the insulating layer. In other words, a higher etching selectivity is given to the insulating layer, with respect to the silicon substrate 101.

The second condition in the step 117 specifies, contrary to the step 115, a selective etching of the silicon (silicon substrate 101), rather than the insulating layer. In other words, a higher etching selectivity is given to the silicon substrate 101, with respect to the insulating layer such as the sidewall 107.

In step 105 of forming the sidewall 107 and forming the scraped section 121, it is preferable to scrape off a portion of the silicon substrate 101 adjacent to the gate electrode 105, by a depth of 5 nm or more, more preferably 10 nm or more from a surface of the silicon substrate 101 right under the gate electrode 105. Such configuration more effectively prevents the slip-in, in case of using a metal to form silicide layer which have a character to slip-in like nickel, and further assures securing an effective junction depth of the source/drain region 109.

Also in the step 105, it is preferable to scrape off a portion of the silicon substrate 101 adjacent to the gate electrode 105, by a depth of 50 nm or less, more preferably 30 nm or less from a surface of the silicon substrate 101 right under the gate electrode 105. Such configuration further assures the prevention of the reduction in thickness of the sidewall 107 during the formation of the scraped section 121, thus more securely protects the side of the gate electrode 105.

In the step 111 of forming the Ni layer 115, it is preferable to form the Ni layer 115 to be thinner than the scraped depth of the scraped section 121 from the chip-side surface 123. Such configuration further enhances the suppressing effect against the slip-in of the Ni layer 115 into the source/drain region 109.

Further, the method according to this embodiment may include the following steps.

Step 119: forming an SD extension region 108 on the silicon substrate 101 using the gate electrode 105 as a mask, after the step 101 and before the step 103; and Step 121: heating the silicon substrate 101 so as to activate the dopant, after the step 107 of forming the source/drain region 109 and before the step 111 of forming the Ni layer 115.

Referring now to FIGS. 2A to 2C and 3A to 3C, the manufacturing process of the semiconductor device 100 will be described in further details.

Figure 2A:
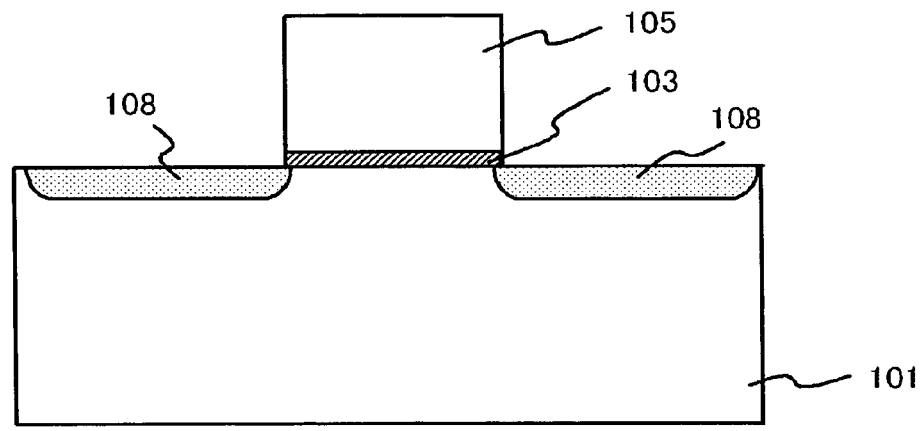
FIGS. 2A to 2C are cross-sectional views sequentially showing a manufacturing process of the semiconductor device of FIG. 1.

Firstly, as shown in FIG. 2A, an isolation region (not shown) based on a known STI (Shallow Trench Isolation) forming process is formed on the silicon substrate 101, having a main surface of silicon (100). The isolation region may be formed by another known process such as LOCOS. Thereafter, a dopant of the opposite conductive type to the source/drain region 109 may be ion-implanted to a region close to the surface of the silicon substrate 101 to thereby form a pocket region (not shown) or a well (not shown).

Then thermal oxidation is performed to form an oxide layer on the silicon substrate 101. On the oxide layer, a polycrystalline silicon layer is formed in a thickness of, for example, 50 to 200 nm.

Over the silicon substrate 101, a photoresist layer is provided so as to selectively cover a region where the gate insulating layer 103 is to be formed. Then a dry etching process is performed to selectively remove a portion of the polycrystalline silicon layer and the oxide layer other than the region where the gate insulating layer 103 is to be formed, so as to shape the polycrystalline silicon layer and the oxide layer into the pattern of the gate insulating layer 103 and the gate electrode 105 (step 101).

Then ion implantation is performed utilizing the gate electrode 105 as a mask, thus to form an SD extension region which serves for an electrical connection between the channel region and the source/drain region 109 (step 103, FIG. 2A). The SD extension region 108 should be of the same conductive type as that of the source/drain region 109.

Figure 2B:
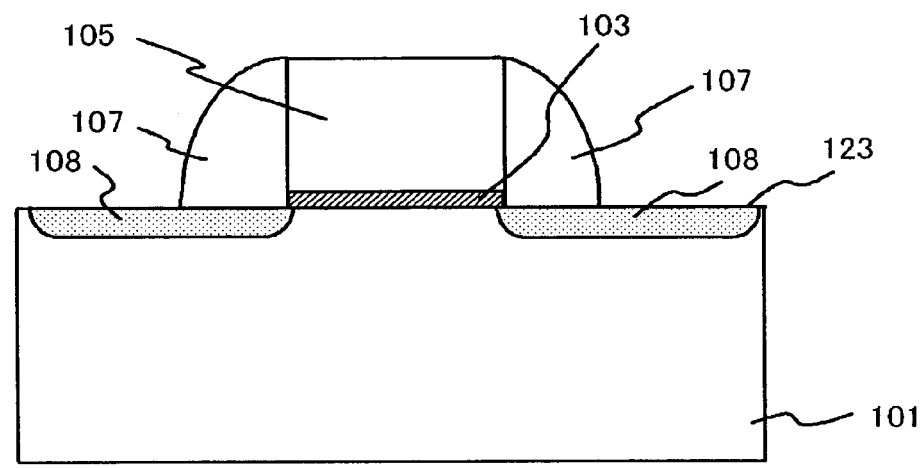

Proceeding to FIG. 2B, for example a CVD (Chemical Vapor Deposition) process is performed to deposit an insulating layer, which is to serve as the sidewall 107, on the chip-side surface of the silicon substrate 101, so as to cover the gate electrode 105. The insulating layer may be constituted of a silicon oxide layer or a nitride layer. The insulating layer may be formed in a thickness of 10 to 100 nm.

Then a dry etching process is performed to etch back the insulating layer, to thereby form the sidewall 107 on the respective sides of the gate electrode 105 (step 105, step 115). In this process, it is preferable to stop the etching back when the insulating layer covering the chip-side surface 123 is removed to the extent that the chip-side surface 123 is substantially exposed, in order to prevent the chip-side surface 123 from being over-etched. Also, it is preferable to perform the etching back such that the insulating layer is etched at a higher etching rate than the silicon. For example, when forming the surface of the sidewall 107 in a mild slope with respect to the chip-side surface 123, it is preferable to employ CF4, CHF3, O2 and Ar as the etching gas, and set the chamber pressure at a relatively low level. When forming the sidewall 107 in a steeper slope, it is preferable to employ, for example, C4F8, O2 and Ar as the etching gas and set the chamber pressure at a relatively higher level.

Figure 2C:
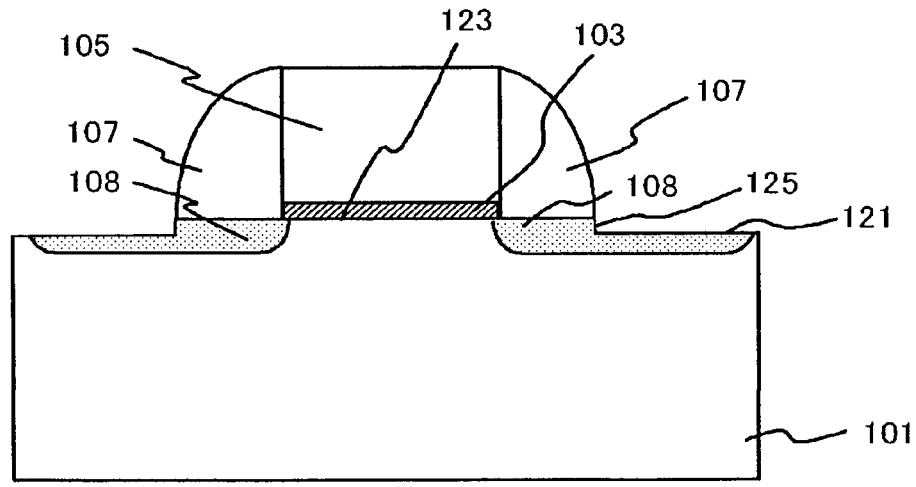

Referring to FIG. 2C, the silicon substrate 101 in a region between the sidewall 107 and the isolation region (not shown), where the source/drain region 109 is to be formed, is removed by dry etching, thus to form the scraped section 121 parallel to the chip-side surface 123 (step 105, step 117). It is preferable to perform the etching such that the silicon is etched at a higher etching rate than the material of the sidewall 107. Specifically, it is preferable to employ only CF4 and O2 as the etching gas. Also, since the silicon etching rate becomes higher when the flow of the O2 is reduced, controlling the flow rate of O2 enables controlling the etching rate of the silicon substrate 101. The scraping depth (step height) between the scraped section 121 and the chip-side surface 123 in a direction of the normal of the substrate is set in a range of, for example, 10 nm to 30 nm.

Also, it is preferable to determine the etching condition such that the surface of the stepped portion formed between the scraped section 121 and the chip-side surface 123 is vertically formed, thus forming a vertical surface 125 parallel to the normal of the chip-side surface 123. The presence of the vertical surface 125 allows enhancing the sputtering anisotropy in the subsequent sputtering process for forming the Ni layer 115, thereby preventing the nickel from sticking to the vertical surface 125. Accordingly, in the siliciding process that follows, the Ni layer 115 on the sidewall 107 can be prevented from slipping into the source/drain region 109 via the vertical surface 125. Such arrangement, therefore, prevents the overreaction of the nickel with the silicon in the source/drain region 109, thereby further assuring the restriction against the reduction in junction depth of the source/drain region 109.

Figure 3A:
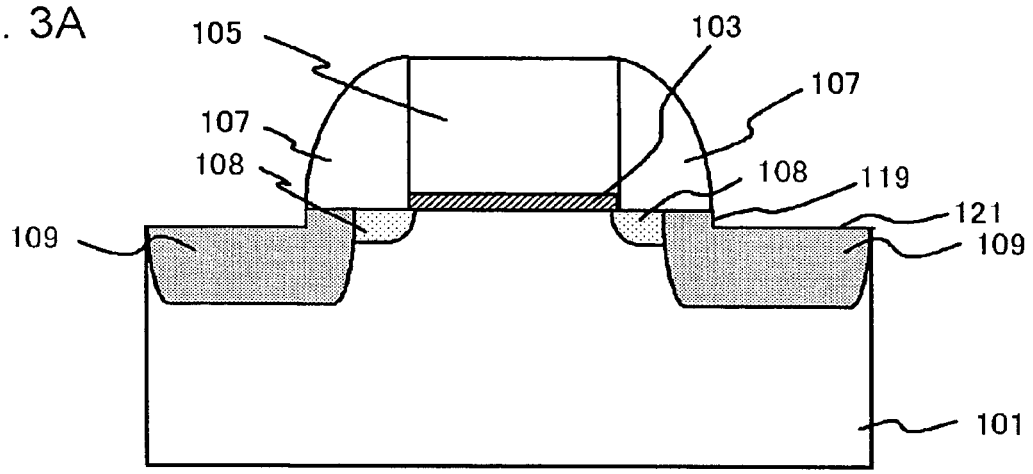
FIGS. 3A to 3C are cross-sectional views sequentially showing a manufacturing process of the semiconductor device of FIG. 1.

Proceeding to FIG. 3A, a dopant of the same conductive type as that of the dopant implanted into the SD extension region 108 is ion-implanted into the silicon substrate 101, utilizing the gate electrode 105 and the sidewall 107 as a mask. This ion implantation leads to the formation of the source/drain region 109 deeper than the SD extension region 108, around the gate electrode 105 (step 107).

Then, spike RTA (Rapid Thermal Annealing) process is performed, for example, so as to activate the source/drain region 109. A maximum target temperature of the surface of the silicon substrate 101 in the spike RTA process may be set in a range of 1000 to 1100 degree C.

The chip-side surface of the silicon substrate 101 is then subjected to a pretreatment for the nickel sputtering. The pretreatment is the cleaning of the surface of the silicon substrate 101 with a chemical solution (step 109). The cleaning process eliminates a surface chemical oxide layer and foreign substances on the surface of the silicon substrate 101, thereby further assuring the siliciding effect of the region on the source/drain region 109.

In the cleaning process of the silicon substrate 101, it is preferable to keep the scraped section 121 formed on the silicon substrate 101 from being etched. However, an unintentional etching effect may be incurred in this process, as long as that effect is practically negligible. The etching effect is permissible when, for example, a change in height of the scraped section 121 is smaller than the scraped depth of the scraped section 121 from the chip-side surface 123. Also, it is preferable that the change in height of the scraped section 121 because of the cleaning process is less than 5 nm. For example, employing an APM (a mixture of ammonium, hydrogen peroxide, and water) or diluted HF as the chemical solution for the cleaning process allows properly protecting the silicon substrate 101 from being etched.

Figure 3B:
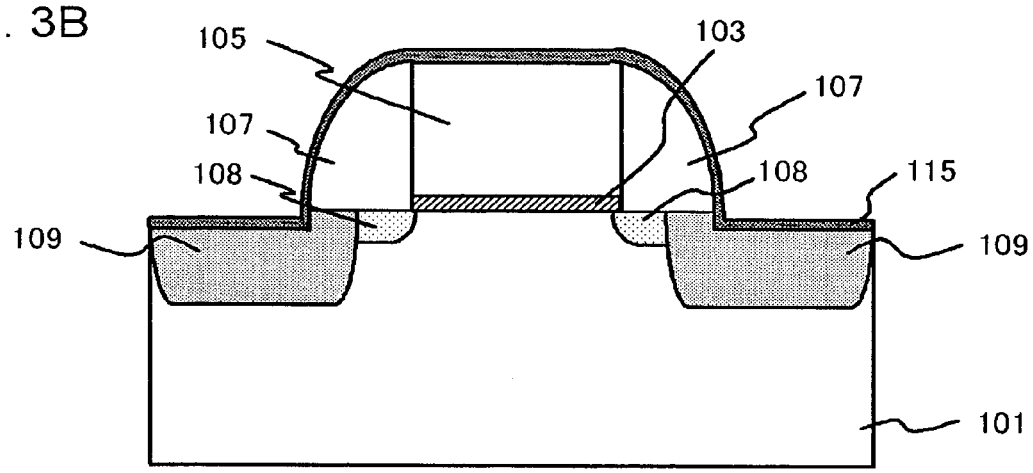

Referring now to FIG. 3B, a sputtering process is performed to form Ni layer 115 in a thickness of approximately 5 to 20 nm all over the chip-side surface of the silicon substrate 101 (step 111). The formation of the Ni layer 115 may be performed under a room temperature sputtering. The thickness of the Ni layer 115 is determined according to the scraped depth of the scraped section 121 from the chip-side surface 123. Forming the Ni layer 115 so as to be thinner than the scraped depth of the scraped section 121 from the chip-side surface 123 results in the formation of a region where the Ni layer 115 is not adhere, on the vertical surface 125. Such configuration effectively suppresses the slip-in of the Ni layer 115 from the sidewall 107 during a sintering process. Here, following the sputtering of the Ni layer 115, TiN may be sputtered in a depth of 5 to 10 nm, to prevent oxidation of the surface of the Ni layer 115.

Then a sintering process is performed in two steps. In a first-step sintering, the silicon substrate 101 with the Ni layer 115 formed thereon is annealed under a low temperature, so that a semi-stable Ni-silicide is formed on the source/drain region 109 and on the gate electrode 105. The temperature for the first-step sintering may be set in a range of 250 to 500 degree C. The sintering time may be set longer than zero second, and 60 seconds or shorter.

Figure 3C:
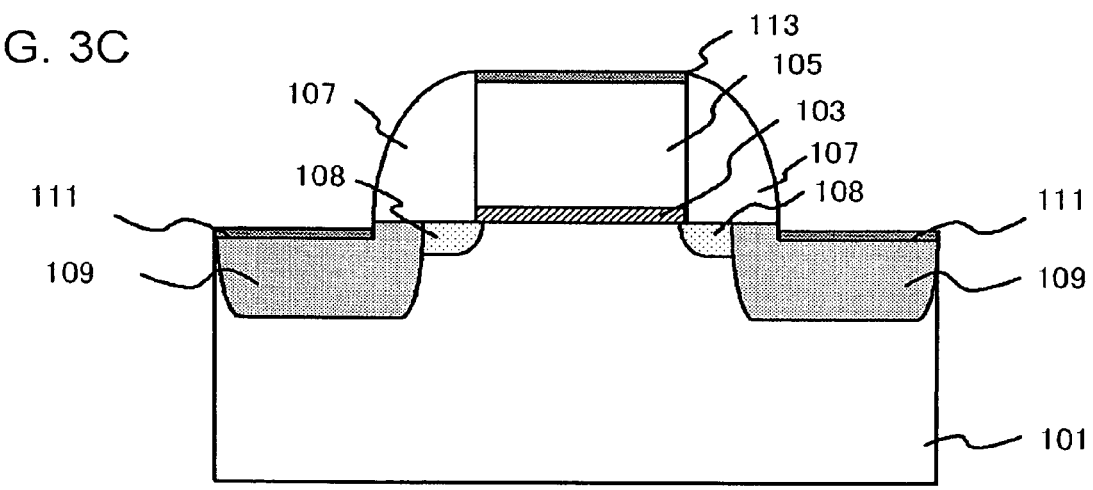

Proceeding to FIG. 3C, the unreacted portion of the Ni layer 115 is removed by a wet etching process. A second-step sintering is then performed, to anneal the silicon substrate 101 at a predetermined temperature so that Ni and Si react, thus forming the silicide layer (step 113). The temperature for the second-step sintering may be set higher than in the first-step sintering. Through the foregoing steps, the semiconductor device 100 shown in FIG. 1 can be obtained. After the foregoing steps, formation of a contact plug or a predetermined interconnect may be performed on predetermined positions on the semiconductor device 100.

A feature of this embodiment is scraping off, prior to forming the source/drain region 109, a portion of the chip-side surface 123 of the silicon substrate 101 by etching, thereby intentionally forming the generally horizontal scraped section 121 on the chip-side surface 123.

Normally, channel dopants of the opposite conductive type to those of the source/drain region 109 are diffused, in the vicinity of the chip-side surface 123. Although the channel dopants are implanted to a region close to the chip-side surface 123, actually the dopants diffuse in a certain distribution pattern in the source/drain region 109, from the chip-side surface 123 toward an inner portion of the substrate. Forming the scraped section 121, accordingly, removes a region where the channel dopants diffuse. Such arrangement allows more securely attaining an effective junction depth of the source/drain region 109, compared with the case of forming the source/drain region 109 from the chip-side surface 123. Also, in case of providing a predetermined well or pocket in the MOSFET 102, forming the scraped section 121 offers the similar advantageous effect.

Further, since the scraped section 121 is formed before forming the source/drain region 109, the upper surface of the source/drain region 109 formed in a predetermined depth can be prevented from being intentionally scraped further in subsequent processes. Therefore, unlike the steps according to the patented document 1, the depth of the source/drain region 109 is not reduced, which provides a significantly larger suppressing effect against the junction leak current.

To be more detailed, in this embodiment, the etching back of the sidewall 107 is followed by the removal of the exposed chip-side surface 123 of the substrate 101, thereby forming the scraped section 121. After forming the scraped section 121, the source/drain region 109 is no longer intentionally scraped off. Such arrangement allows securing a sufficient effective junction depth under the Ni-silicide layer 111. Accordingly, the nickel is inhibited from leaking which is caused from reduction in height of the upper surface of the source/drain region 109 resulted from the reaction of giving NiSi2. Formation of NiSi2 enhances the junction leakage current, since NiSi2 consumes more silicon atoms and the high concentration region under the NiSi2 becomes thinner as compared with NiSi. Here, according to this embodiment, since the SD extension region 108 is formed before forming the source/drain region 109, the electrical connection between the channel region and the source/drain region 109 can be more effectively secured.

In this embodiment, independent etching processes are performed to form the scraped section 121 and the sidewall 107. Such arrangement permits setting a larger difference of etching selectivity between the silicon and the material for the sidewall 107. Accordingly, the sidewall 107 can be stably formed in a desired shape. Also, the sidewall 107 can be protected from being scraped by the etching, in the formation process of the scraped section 121.

In the method according to the patented document 1, when the silicon substrate is unintentionally etched under the condition for selectively etching the insulating layer that constitutes the spacer or the buffer layer, a damaged layer may be formed on the silicon surface. In contrast, according to this embodiment, forming the scraped section 121 and the sidewall 107 in the separate steps effectively prevents the formation of the damaged layer on the surface of the silicon substrate 101 during the formation of the sidewall 107.

According to this embodiment, after forming the scraped section 121 the entire surface of the silicon substrate 101 is cleaned with a chemical solution before forming the Ni layer 115, so that the surface of the silicon substrate 101 becomes clear of residues and foreign substances. Such arrangement assures full adhesion of the Ni layer 115 to the silicon substrate 101, thereby stabilizing the structure of the Ni layer 115.

In this embodiment, Ni is employed to constitute the silicide layer. When employing Ni, as stated earlier, the slip-in of Ni may take place from the sidewall 107 to the source/drain region 109.

However, the etching back of the sidewall 107 is followed by the removal of the chip-side surface 123 of the silicon substrate 101, thereby forming the scraped section 121 and securing a sufficient effective junction depth under the Ni-silicide layer 111, according to this embodiment. Accordingly, the nickel is inhibited from leaking which is caused by reduction in height of the upper surface of the source/drain region 109, resulted from the reaction of giving NiSi2.

Further, when forming the scraped section 121, the vertical surface 125 is formed adjacent to the sidewall 107. Accordingly, in a region from the sidewall 107 to the vertical surface 125, an interruption region where the Ni layer 115 is not present tends to be formed. The presence of the interruption region prevents the Ni layer 115 formed above the interruption region from slipping down into the source/drain region 109. Such effect is prominently achieved, as shown in FIG. 3B, when the upper surface of the Ni layer 115 is at a lower level, i.e. closer to an inner portion of the substrate, than the chip-side surface 123 of the silicon substrate 101. In this case, as shown in FIG. 3C, the upper surface of the Ni-silicide layer 111 is located lower than the chip-side surface 123 of the silicon substrate 101.

Further, on the vertical surface 125 also, the Ni layer 115 is reacted with silicon. Accordingly, even though the Ni layer 115 slips into the vertical surface 125 from the sidewall 107, the Ni layer 115 that has reached the vertical surface 125 is consumed thereon. Thus, the slip-in of the nickel into a depth direction of the silicon substrate 101 and the siliciding reaction with the silicon from the substrate depth direction can be controlled.

As described above, the method according to the foregoing embodiment allows preventing the reduction in depth of the source/drain region 109 in a region close to the sidewall 107, in the formation process of the Ni-silicide layer 111. Accordingly, the method effectively suppresses occurrence of a junction leak current in the source/drain region 109. The method consequently suppresses, even when the distance between the gates is reduced, the occurrence of the junction leak current on the source/drain region 109, originating from the overreaction between the silicon substrate 101 and Ni.

More specifically, in a semiconductor device in which the width of the diffusion layer on the silicon substrate in a cross-sectional view taken along a direction of the gate length, in other words the distance between a lateral edge of the gate electrode of the diffusion layer and a lateral edge of the isolation layer on the silicon substrate surface, is 0.16 μm or less, the slip-in of Ni from the sidewall prominently takes place. The method according to this embodiment prevents the slip-in of the Ni layer 115 from the sidewall 107 to the source/drain region 109, even in such a micronized structure. The method consequently upgrades the stability of the semiconductor device 100 during the manufacturing process.

In addition, this embodiment executes the heat treatment for siliciding in two steps, namely the first-step sintering and the second-step sintering. In the first-step sintering, a relatively low temperature is applied so that the siliciding reaction stably takes place under a mild condition. Such arrangement results in upgraded stability of the Ni-silicide layer 111 and the Ni-silicide layer 113 during the manufacturing process.

Although the embodiment of the present invention has been described in details referring to the drawings, the foregoing embodiment is only exemplary and various modifications may be made within the scope of the present invention.

Figure 4A:
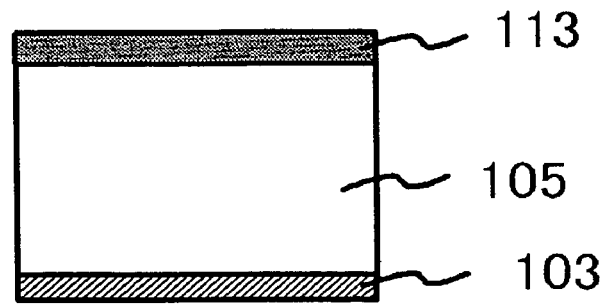
FIGS. 4A to 4C are cross-sectional views showing a structure of a gate electrode of the semiconductor device according to the embodiment.
Figure 4B:
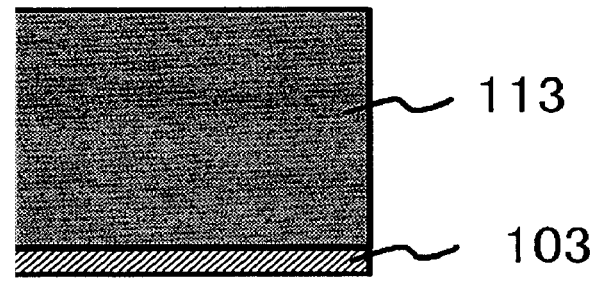
Figure 4C:
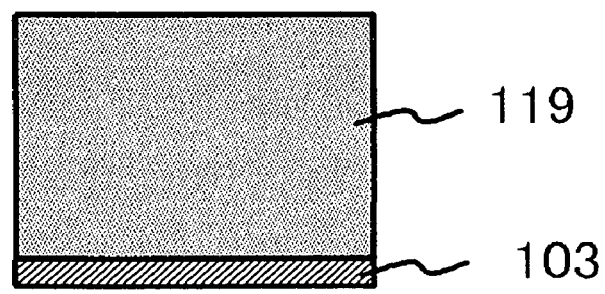

For example, although the polycrystalline silicon is employed as the material of the gate electrode 105 in the embodiment, the gate electrode 105 may be constituted of various other materials. FIGS. 4A to 4C schematically show structures of the gate electrode of the semiconductor device 100.

FIG. 4A corresponds to the structure of the semiconductor device 100 shown in FIG. 1. In FIG. 4A, the gate electrode 105 is constituted of the polycrystalline silicon, and the Ni-silicide layer 113 is provided thereon.

In FIG. 4B, the entire gate electrode is constituted of the Ni-silicide layer 113.

In FIG. 4C, a metal layer 119 is provided so as to serve as the gate electrode. The gate electrode constituted of the metal layer 119 may be obtained through the following steps. Firstly, the semiconductor device 100 as shown in FIG. 1 is formed. Then a mask constituted of an insulating layer for example that covers the entire chip-side surface of the silicon substrate 101, except a topmost region of the gate electrode 105, is provided. Utilizing such mask, the Ni-silicide layer 113 and the gate electrode 105 are selectively and sequentially removed. Thereafter, the metal layer 119 is formed selectively in the region from which the Ni-silicide layer 113 and the gate electrode 105 have been removed. Alternatively, when forming the semiconductor device 100 as shown in FIG. 1, the gate electrode 105 may be formed of a material that can be easily removed by etching in a subsequent step, so that after etching that material the metal layer 119 may be provided so as to fill in the etched region.

It is apparent that the present invention is not limited to the above embodiment, and may be modified and changed without departing from the scope and spirit of the invention.

What is claimed is:

1. A method of manufacturing a semiconductor device, comprising:
   forming a gate electrode ever a silicon substrate;
   forming an insulating layer over said gate electrode;
   forming a sidewall that covers a side of said gate electrode by etching back said insulating layer formed on said gate electrode and on said silicon substrate;
   selectively etching said silicon substrate, thereby forming a scraped surface in a region adjacent to said sidewall;
   ion-implanting a dopant into said silicon substrate through said scraped surface around said gate electrode after forming said sidewall and said scraped surface, thereby forming a source/drain region such that an over-etching of said silicon substrate is inhibited after said forming of said source/drain region;
   forming a metal layer on said scraped surface of said silicon substrate; and
   reacting said metal layer with said silicon substrate thereby forming a silicide layer on said source/drain region.

2. The method according to claim 1, further comprising:
   cleaning an entire surface of said silicon substrate with a chemical solution, after forming said source/drain region and before forming said metal layer on said scraped surface.

3. The method according to claim 1, wherein said forming said sidewall and said forming said scraped surface further comprise:
   removing said insulating layer on said gate electrode and on said silicon substrate by etching back under a first condition thereby forming said sidewall and exposing said silicon substrate, and
   etching said silicon substrate under a second condition thereby forming said scraped surface.

4. The method according to claim 3, wherein said second condition comprises selectively etching silicon with respect to said insulating layer.

5. The method according to claim 4, wherein said forming said metal layer further comprises forming said metal layer thinner than a scraped depth of said scraped surface.

6. The method according to claim 1, wherein said metal layer comprises nickel, and
   wherein said silicide layer comprises a nickel silicide layer.

7. The method according to claim 1, wherein said forming said sidewall and said forming said scraped surface further comprise scraping said silicon substrate adjacent to said gate electrode by a depth of 5 nm to 50 nm with respect to a region right under said gate electrode.

8. The method according to claim 1, further comprising:
   forming a source/drain extension region in said silicon substrate around said gate electrode, before said forming said sidewall and said scraped surface.

9. The method according to claim 1, further comprising:
   heating said silicon substrate thereby activating said dopant, after said forming said source/drain region and before said forming said metal layer.

10. The method according to claim 1, wherein said ion-implanting said dopant into said silicon substrate is performed through said scraped surface that is exposed to said dopant.

11. The method according to claim 10, wherein said ion-implanting said dopant into said silicon substrate is performed immediately after said selectively etching said silicon substrate.

* * * * *